United States Patent
Gu et al.

(10) Patent No.: US 9,319,216 B2
(45) Date of Patent: *Apr. 19, 2016

(54) OPERATING METHOD OF HUMAN INTERFACE DEVICE

(71) Applicant: PIXART IMAGING INC., Hsin-Chu County (TW)

(72) Inventors: Ren-Hau Gu, Hsin-Chu (TW); Hsiang-Sheng Liu, Hsin-Chu (TW); Yen-Min Chang, Hsin-Chu (TW)

(73) Assignee: PIXART IMAGING INC., Hsin-Chu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/534,004

(22) Filed: Nov. 5, 2014

(65) Prior Publication Data

US 2015/0063513 A1    Mar. 5, 2015

Related U.S. Application Data

(63) Continuation-in-part of application No. 13/617,514, filed on Sep. 14, 2012, now Pat. No. 8,907,730, which is a continuation-in-part of application No. 12/948,265, filed on Nov. 17, 2010, now Pat. No. 8,283,983.

(30) Foreign Application Priority Data

Nov. 18, 2009 (TW) ............................. 98139076 A

(51) Int. Cl.
*H04L 7/00* (2006.01)
*H04L 7/04* (2006.01)
*G06F 1/04* (2006.01)
*G06F 1/12* (2006.01)
*H03L 7/08* (2006.01)

(52) U.S. Cl.
CPC ............... *H04L 7/0016* (2013.01); *G06F 1/04* (2013.01); *G06F 1/12* (2013.01); *H03L 7/0807* (2013.01); *H04L 7/04* (2013.01); *H04L 7/048* (2013.01)

(58) Field of Classification Search
CPC ............... G06F 1/12; H03L 7/06; H03L 7/08; H03L 7/085; H03L 7/087; H04L 7/046; H04L 7/0331; H04L 7/10; H04L 7/08; H04L 7/041; H04L 7/00; H04L 7/048; H04L 7/0016; H04L 7/0029; H04L 7/0041
USPC ......................... 331/44, 1 A, 34, 16, 17, 1 R; 713/500–503; 375/226, 220, 371, 373, 375/376, 354; 327/159, 166, 160, 299
See application file for complete search history.

(56) References Cited

U.S. PATENT DOCUMENTS

| | | | |
|---|---|---|---|
| 6,407,641 B1 | 6/2002 | Williams et al. | |
| 7,583,771 B2 * | 9/2009 | Zweigle et al. | 375/355 |
| 8,407,508 B2 | 3/2013 | Lee et al. | |
| 8,677,173 B2 | 3/2014 | Wang et al. | |
| 8,907,730 B2 * | 12/2014 | Wu et al. | 331/1 A |
| 2008/0291863 A1 | 11/2008 | Agren | |

FOREIGN PATENT DOCUMENTS

EP    1087564 A2    3/2001
EP    1185013 A2    3/2002

OTHER PUBLICATIONS

Bluetooth, "Specification of the Bluetooth System", Version 3.0 + HS, Apr. 21, 2009, of "Architecture", pp. 64-65 of "Baseband Specification", and pp. 21-43 of "USB Transport Layer".

* cited by examiner

*Primary Examiner* — Ryan Johnson
(74) *Attorney, Agent, or Firm* — Hauptman Ham, LLP

(57) ABSTRACT

An operating method of a human interface device includes the steps of: counting an oversampling number of an oversampling signal and estimating an accumulated bit number of a USB data stream according to the oversampling signal; calculating a difference between the oversampling number and M times of the accumulated bit number when the accumulated bit number is larger than a predetermined value; and calibrating detected information obtained operating with the oversampling signal according to the correction parameter.

16 Claims, 10 Drawing Sheets

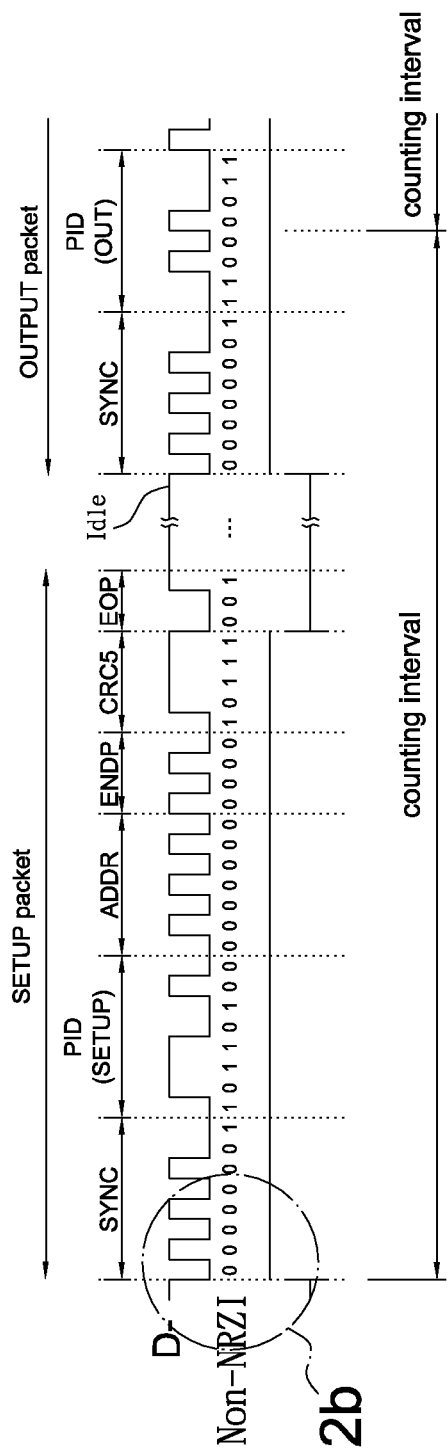
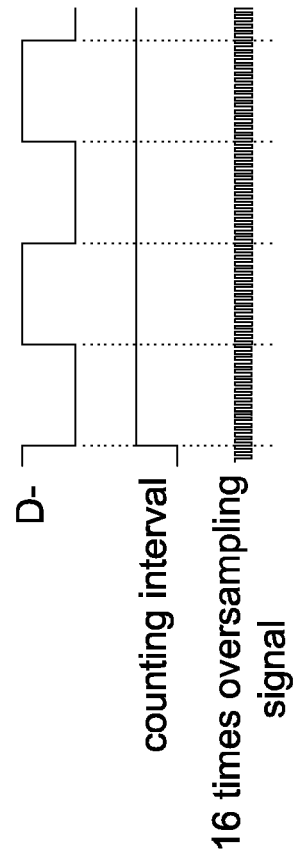
FIG. 2a
FIG. 2b

|  | Low-speed Downstream |||| 
|  | Next Transition || Paired Transition ||
|  | Each (ns) | Total (ns) | Each (ns) | Total (ns) |
|---|---|---|---|---|
| Host Driver Jitter<br>Host Frequency Tolerance(worst-case) | 2.0<br>1.7/bit | 2.0<br>12.0 | 1.0<br>1.7/bit | 1.0<br>24.0 |
| Source (Host) Jitter Total<br>Hub with Low-speed Device Jitter<br>Remaining (full-speed) Hubs' Jitter | 45.0<br>3.0 | 14.0<br>45.0<br>12.0 | 15.0<br>1.0 | 25.0<br>15.0<br>4.0 |
| Jitter Spec<br>Function Frequency Tolerance | 10.0/bit | 71.0<br>70.0 | 10.0/bit | 44.0<br>140.0 |
| Function Receiver Jitter Budget |  | 141.0 |  | 184.0 |

FIG. 3

| oversampling number | bit number | frequency range |
|---|---|---|
| 24 > x | 1 | 36MHz > x |
| 40 > x > 24 | 2 | 30MHz > x > 18MHz |
| 56 > x > 40 | 3 | 28MHz > x > 20MHz |
| 72 > x > 56 | 4 | 27MHz > x > 21MHz |
| 88 > x > 72 | 5 | 26.4MHz > x > 21.6MHz |
| 104 > x > 88 | 6 | 26MHz > x > 22MHz |
| x > 104 | 7 | x > 22.28MHz |

FIG. 4

| initial clock error | ideal 64 bits time | shortest time(ns) | longest time(ns) | min OS No. | max OS No. | clock min range(MHZ) | | clock max range(MHZ) | | up step | increased f (MHz) | | down step | decreased f (MHz) | | max error(%) |
|---|---|---|---|---|---|---|---|---|---|---|---|---|---|---|---|---|
| | | | | | | | | | | | min f | max f | | min f | max f | |
| 1.00% | 42667(ns) | 42483 | 42851 | 1007 | 1041 | 23.477 | 23.680 | 24.270 | 24.480 | 3 | 23.807 | 24.100 | -3 | 23.850 | 24.150 | 0.805 |
| 1.25% | 42667(ns) | 42483 | 42851 | 1005 | 1043 | 23.430 | 23.633 | 24.317 | 24.527 | 3 | 23.760 | 24.053 | -3 | 23.897 | 24.197 | 1.000 |
| 1.5% | 42667(ns) | 42483 | 42851 | 1002 | 1046 | 23.360 | 23.562 | 24.387 | 24.598 | 4 | 23.800 | 24.122 | -4 | 23.827 | 24.158 | 0.833 |
| 1.75% | 42667(ns) | 42483 | 42851 | 1000 | 1048 | 23.313 | 23.515 | 24.434 | 24.645 | 4 | 23.753 | 24.075 | -4 | 23.874 | 24.205 | 1.027 |
| 2% | 42667(ns) | 42483 | 42851 | 997 | 1051 | 23.243 | 23.445 | 24.504 | 24.716 | 5 | 23.793 | 24.094 | -5 | 23.854 | 24.166 | 0.861 |
| 2.25% | 42667(ns) | 42483 | 42851 | 995 | 1054 | 23.197 | 23.398 | 24.574 | 24.786 | 6 | 23.856 | 24.177 | -6 | 23.794 | 24.126 | 0.860 |
| 2.5% | 42667(ns) | 42483 | 42851 | 992 | 1056 | 23.127 | 23.327 | 24.620 | 24.833 | 6 | 23.787 | 24.107 | -6 | 23.840 | 24.173 | 0.888 |
| 2.75% | 42667(ns) | 42483 | 42851 | 990 | 1059 | 23.080 | 23.280 | 24.690 | 24.904 | 7 | 23.850 | 24.190 | -7 | 23.780 | 24.134 | 0.915 |
| 3% | 42667(ns) | 42483 | 42851 | 987 | 1061 | 22.010 | 23.209 | 24.737 | 24.951 | 7 | 23.780 | 24.119 | -7 | 23.827 | 24.181 | 0.917 |

FIG. 8

OPERATING METHOD OF HUMAN INTERFACE DEVICE

CROSS REFERENCE TO RELATED APPLICATION

This application is a continuation-in-part application of U.S. Ser. No. 13/617,514, filed on Sep. 14, 2012, the full disclosure of which is incorporated herein by reference.

BACKGROUND

1. Field of the Invention

This invention generally relates to a data transmission structure and method and, more particular, to a frequency calibration device and method for automatically calibrating the oscillation frequency of a programmable oscillator according to a data stream.

2. Description of the Related Art

An oscillation circuit with external clock can be used to provide a clock signal, and the oscillation circuit conventionally uses an external precise clock component, such as a crystal resonator or a ceramic resonator, to provide a reference frequency to the oscillation circuit. However, the external precise clock component not only increases the system cost, the control chip of the oscillation circuit also needs one or two extra pins to be served as a communication interface to the precise clock component.

In addition to using the reference frequency provided by the external precise clock component, the control chip can also use such as a phase locked loop (PLL) or a delay locked loop (DLL) to match the internal frequency thereof with the data rate of received data stream. However, this method usually takes longer calibration time and thus is adapted to certain applications, such as USB devices.

Accordingly, it is necessary to provide a frequency calibration device and method that does not require an external precise clock component and can calibrate the oscillation frequency of a programmable oscillator quickly and automatically so as to solve the problems in the art.

SUMMARY

An object of the present disclosure is to provide a frequency calibration device and method for a programmable oscillator without the use of an external oscillator that can automatically calibrate the oscillation frequency of the programmable oscillator according to arbitrary packet types in a USB data stream received.

An object of the present disclosure is to provide a frequency calibration device and method for a programmable oscillator that can calibrate the oscillation frequency of the programmable oscillator during data transmission to prevent the frequency drift of the programmable oscillator caused by environmental changes.

The present invention provides an operating method of a human interface device including the steps of: estimating an accumulated bit number of bits between a first bit of a SYNC field and a bit immediately preceding an End-of-Packet of a data packet in a USB data stream according to a clock signal and counting an oversampling number of the clock signal; comparing the oversampling number and M times of the accumulated bit number when the accumulated bit number exceeds a predetermined value; determining a correction parameter according to a ratio between the oversampling number and the M times of the accumulated bit number; and calibrating, using the correction parameter, detected information obtained according to the clock signal.

The present invention further provides an operating method of a human interface device including the steps of: estimating an accumulated bit number of bits between a first bit of a SYNC field and a bit immediately preceding an End-of-Packet of a data packet in a USB data stream according to a clock signal and counting an oversampling number of the clock signal; comparing the oversampling number and M times of the accumulated bit number when the accumulated bit number exceeds a predetermined value; determining a correction parameter according to a ratio between the oversampling number and the M times of the accumulated bit number; and processing raw data detected by the human interface device according to the correction parameter; and calculating detected information according to the processed raw data.

The present invention further provides an operating method of a human interface device, and the human interface device is wirelessly coupled to a programmable oscillator and includes an oscillator, a demodulator and a receiver. The operating method includes the steps of: estimating an accumulated bit number of bits between a first bit of a SYNC field and a bit immediately preceding an End-of-Packet of a data packet in a USB data stream according to a clock signal and counting an oversampling number of the clock signal; comparing the oversampling number and M times of the accumulated bit number when the accumulated bit number exceeds a predetermined value; decreasing a frequency of the clock signal when the oversampling number is larger than the M times of the accumulated bit number; increasing the frequency of the clock signal when the oversampling number is smaller than the M times of the accumulated bit number; receiving a packet for communication request from the human interface device; transmitting a packet for reply to the communication request with a payload including a synchronous signal; receiving the synchronous signal by the receiver; generating an oscillation frequency by the oscillator; mixing the synchronous signal and the oscillation frequency to retrieve a sampled signal; demodulating the sampled signal by the demodulator to retrieve an error correct signal; and calibrating, using the error correct signal, detected information obtained according to the oscillation frequency, wherein the synchronous signal corresponds to the trimmed frequency of the clock signal.

The frequency calibration device and method for a programmable oscillator of the present disclosure uses arbitrary packet types of the Universal Serial Bus (USB), for example, but not limited to, SETUP packet, DATA packet and OUT packet between the Idle state and the End-of-Packet (EOP) as a basis for frequency calibration, such that the use of an external precise clock component is not required. The frequency calibration device and method of the present disclosure is applicable to devices with Universal Serial Bus, such as the USB mouse.

The present invention can be applied in wireless communication. In this application, a device have to communication with a host via a dongle connected to the host or embedded transceiver module of the host. Dongle can generate a calibrated frequency based on a précised clock of host by applying the present invention. Then the device can generate a calibrated oscillation frequency based on the calibrated frequency of dongle.

BRIEF DESCRIPTION OF THE DRAWINGS

Other objects, advantages, and novel features of the present invention will become more apparent from the following detailed description when taken in conjunction with the accompanying drawings.

FIG. 2a is a partial data stream outputted from a USB host.

FIG. 2b is a relational diagram of the oversampling signal of a USB device and the data stream shown in FIG. 2a.

FIG. 3 is the maximum jitter budget required in a low-speed transmission.

FIG. 4 is the bit number corresponding to the oversampling number between adjacent transition edges of the USB data stream in the present invention.

FIG. 8 is the maximum frequency errors after being calibrated once by the frequency calibration method of the present invention.

DETAILED DESCRIPTION OF THE EMBODIMENT

It should be noticed that, wherever possible, the same reference numbers will be used throughout the drawings to refer to the same or like parts.

According to the Universal Serial Bus Specification revision 1.1, the data rate tolerance for a low-speed USB device functioning normally is within ±1.5%, and including the data error of a USB host ±0.25% the data rate tolerance for a built-in oscillator in the low-speed USB device should be within ±1.25% for ensuring a USB interface functioning correctly. Therefore, if the oversampling frequency of a USB device is 24 MHz (i.e. 16 times oversampling ratio), the oscillation frequency of a built-in oscillator in the USB device has to be ranged within 24 MHz±300 KHz. It is appreciated that the oversampling frequency of a USB device is not limit to 24 MHz.

Figure 1:
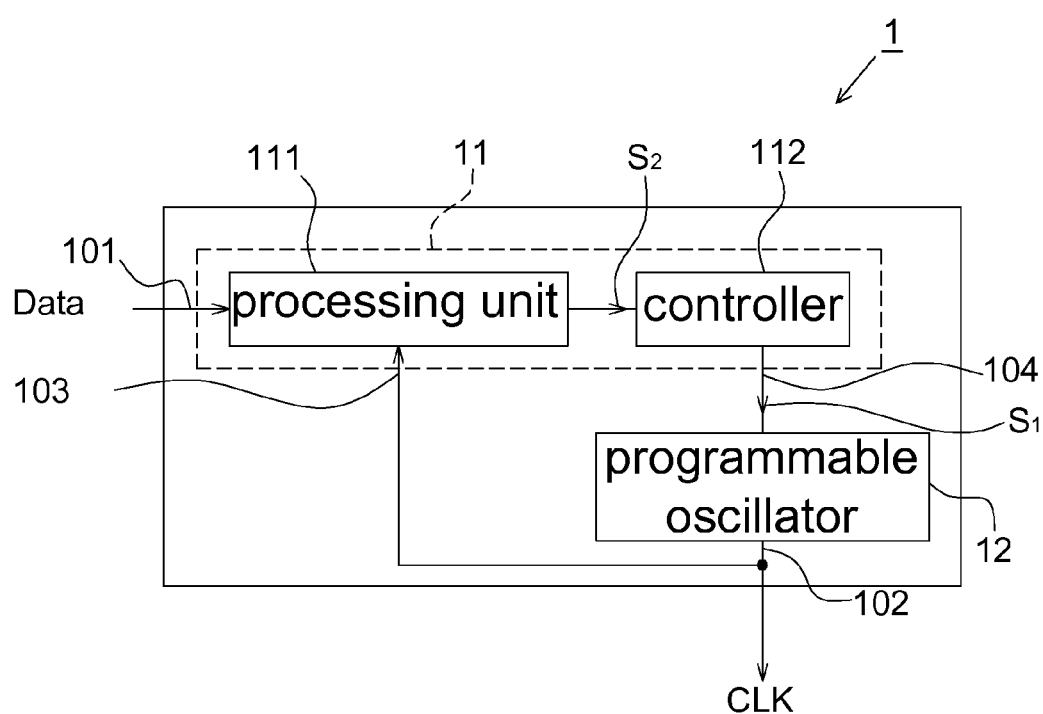
FIG. 1 is a block diagram of the self-calibrating oscillator circuit according to an embodiment of the present invention.

Please refer to FIG. 1, it shows a self-calibrating oscillator circuit 1 according to an embodiment of the present invention, which includes an input terminal 101 and an output terminal 102. The self-calibrating oscillator circuit 1 may be built-in a USB device, such as a USB mouse, served as a local oscillator thereof and may generate a clock signal CLK with programmable frequency according to a USB data stream Data. The clock signal CLK may be, for example, an oversampling signal for the data recovery.

The input terminal 101 is configured to receive a data stream Data from a USB host, and to output a clock signal CLK from the output terminal 102. A difference between a frequency of the clock signal CLK and a data rate of the data stream Data may be calibrated within 0.805% and 1.027% of M times of data rate of the data stream Data, wherein M is a positive integer representing an oversampling ratio. The data stream Data may be arbitrary packet types in the USB data stream, such as SETUP packet, OUTPUT packet, DATA packet or other packet types. In one embodiment, the data stream Data for example may be a low-speed data stream with 1.5 MHz data rate.

The self-calibrating oscillator circuit 1 includes a frequency calibration device 11 and a programmable oscillator 12 coupled to each other. The programmable oscillator 12 may be for example a RC oscillator or any other suitable programmable oscillator. The frequency calibration device 11 receives a data stream Data of a USB host from the input terminal 101. The frequency calibration device 11 further includes a feedback input terminal 103 and a control output terminal 104. The frequency calibration device 11 receives the clock signal CLK feedback from the programmable oscillator 12 through the feedback input terminal 103, and outputs a control signal $S_1$ to the programmable oscillator 12 from the control output terminal 104, wherein the control signal $S_1$ may be for example a digital control signal including plural bits. The programmable oscillator 12 outputs a clock signal CLK to be served as a reference frequency of a USB device according to the control signal $S_1$.

The frequency calibration device 11 includes a processing unit 111 and a controller 112. The processing unit 111 counts an oversampling number (oscillation number) of the feedback clock signal CLK in a counting interval CI, and estimates an accumulated bit number of the data stream Data according to the oversampling signal. When the accumulated bit number is larger than or equal to a predetermined value, compare M times of the accumulated bit number and the oversampling number to output a frequency calibration step $S_2$, wherein the M is a quotient obtained from dividing an expecting oscillation frequency of the programmable oscillator 12 by a data rate of the data stream Data. That is, the M is an oversampling ratio for data recovery of the USB device. In an embodiment, the expecting oscillation frequency of the programmable oscillator 12 may be for example 24 MHz and the data rate of the data stream Data may be for example 1.5 MHz, and thus M is 16 herein. The counting interval CI is determined according to a value of the accumulated bit number, which is larger than or equal to the predetermined value.

The controller 112 is coupled to between the processing unit 111 and the programmable oscillator 112, and outputs the control signal $S_1$ according to the frequency modulation step $S_2$ to calibrate the oscillation frequency of the programmable oscillator 12, wherein one frequency modulation step is the frequency modulation resolution of the programmable oscillator 12 and it may be determined according to the actually utilized programmable oscillator.

Please refer to FIGS. 2a and 2b, FIG. 2a shows a schematic diagram of a partial data packet sent from a USB host to a USB device including a SETUP packet and a part of an OUTPUT packet herein, but actually it may include other packet types. FIG. 2b shows a partial enlargement diagram of FIG. 2a and a relation between 24 MHz oversampling frequency and 1.5 MHz data stream Data. That is, in this embodiment when the build-in oscillator of a USB device is in accurate operation, 16 oversampling points will be sampled in every bit slot of the data packet.

Please refer to FIGS. 1, 2a and 2b simultaneously, the processing unit 111 counts the bits between the first bit of the SYNC field and an immediately previous bit of the End-of-Packet of arbitrary packet types in the data stream Data in a counting interval CI and feedbacks the oversampling number of the clock signal CLK simultaneously, and compares their relationship to determine the frequency calibration step $S_2$ of the programmable oscillator 12. The controller 112 calibrates the oscillation frequency of the programmable oscillator 12 according to the frequency calibration step $S_2$, wherein a counting interval CI is assumed to include at least N bits. When a bit number from the SYNC field to an immediately previous bit of the End-of-Packet (the bits SYNC+PID+ADDR +ENDP+CRC5 shown in FIG. 2a) of the first data packet (e.g. SETUP packet) in the counting interval CI is less than N, the counting is temporarily stopped as receiving the End-of-Packet of the first data packet. And the counting will be restarted when the first bit of the SYNC field of a next data packet (the OUTPUT packet in FIG. 2a) is received again, and the counting will be stopped till the counting is larger than N.

Owing to the jitter existed in the data stream Data during transmission, the bit number included in every counting interval CI has to be able to tolerate the jitter budget of the worst case. Please refer to FIG. 3, it shows a data stream including consecutive ones passing through 5 serially cascaded HUBs. As the standard definition of the USB, one zero will be inserted after six consecutive ones, so called bit stuffing, and it is the worst case mentioned above. As shown in the figure, the paired transition has a largest timing jitter of 184 ns. In low-speed transmission, if the largest timing jitter is divided by the time slot of every bit in the data stream Data and the data rate tolerance (e.g. 184/(666.66×1.25%)=22.08 bits), it is able to obtain that a counting interval CI needs to contain at least 23 bits in the low-speed transmission to prevent the counting error. Details of FIG. 3 can be referred to Universal Serial Bus Specification, revision 1.1.

In the present invention, the method to estimate the bit number of a data stream Data in a counting interval CI is to estimate a bit number between adjacent transition edges and then to accumulate the bit number between consecutive adjacent transition edges. Because the coding method used in USB is Non Return to Zero (NRZI), at most six consecutive ones is possible. When consecutive one occurs in the data stream, no transition edge will appear between consecutive ones. Therefore, the present invention needs to estimate the number of bits within consecutive ones in the data stream.

Please refer to FIGS. 2a, 2b and 4 simultaneously, FIG. 4 shows the bit number corresponding to the oversampling number between adjacent transition edges in a USB data stream in the present invention. When the frequency error of the programmable oscillator 12 is calibrated within 3% before shipment, during estimating the bit number in the data stream Data according to the clock signal CLK, the processing unit 111 can estimate the bit number between adjacent transition edges according to FIG. 4. As shown in FIG. 4, when the oversampling number between two adjacent transition edges is less than 24, the processing unit 111 judges that there is only one bit between the two adjacent transition edges; when the oversampling number between two adjacent transition edges is between 24 and 40, the processing unit 111 judges that there are two bits between the two adjacent transition edges, and so on. Similarly, when the oversampling number between two adjacent transition edges is over 104, the processing unit 111 judges that there are seven bits between the two adjacent transition edges and the data stream includes six consecutive ones and one zero at this moment. In this manner, the processing unit 111 can estimate the bit number between two adjacent transition edges according to the oversampling number corresponding to the adjacent transition edges in the data stream Data, and accumulate the bit number between consecutive adjacent transition edges to obtain the accumulated bit number.

Figure 5:
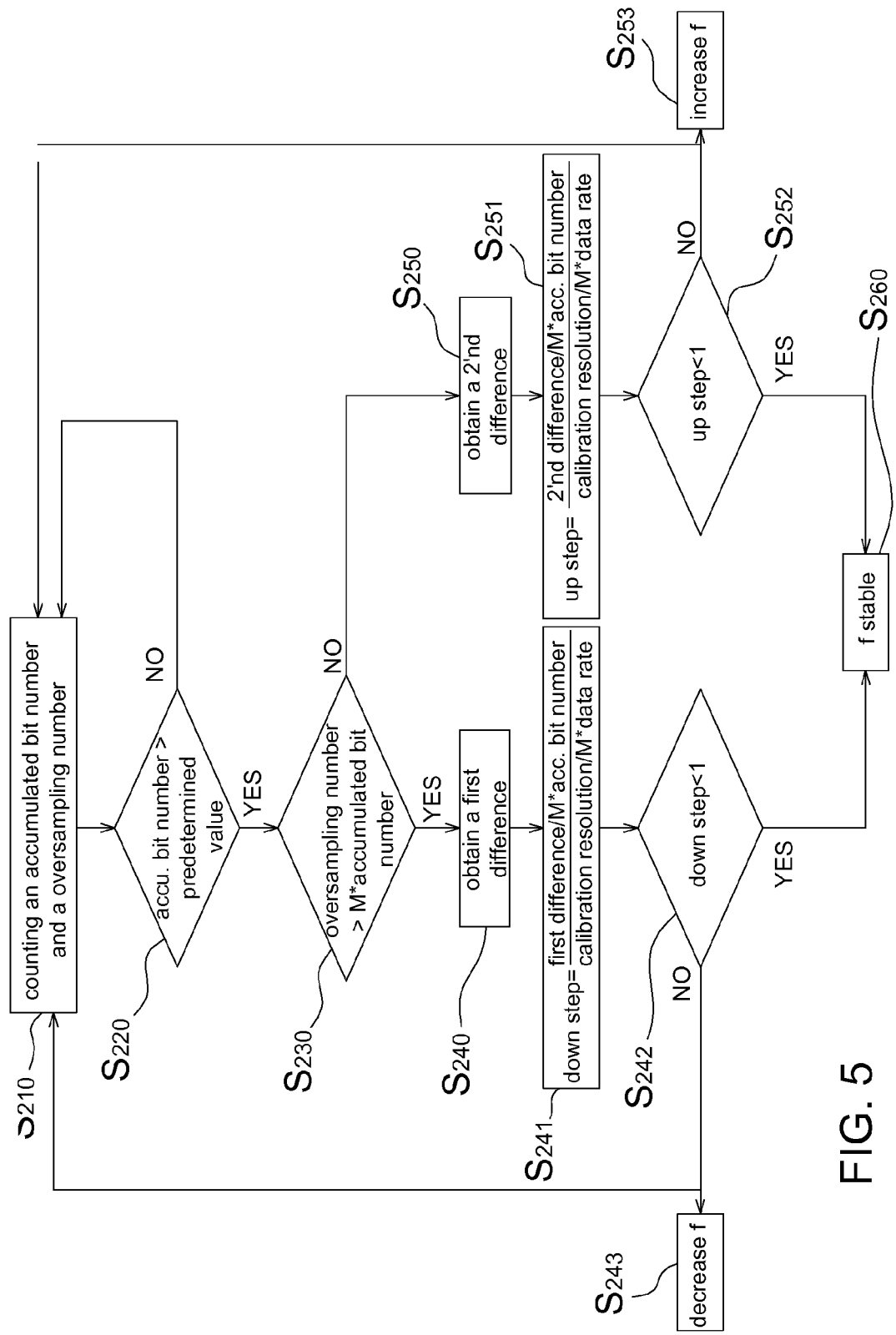
FIG. 5 is a schematic diagram of the frequency calibration method for a programmable oscillator according to an embodiment of the present invention.

Please refer to FIGS. 1, 2a, 2b and 5 simultaneously, FIG. 5 shows a schematic diagram of the frequency calibration method for programmable oscillator according to an embodiment of the present invention. The processing unit 111 calibrates an oscillation frequency of the clock signal CLK generated by the programmable oscillator 12 according to a received USB data stream Data and a clock signal CLK.

Step $S_{210}$: The processing unit 111 receives a USB data stream and a clock signal, counts an oversampling number of the clock signal CLK and estimates an accumulated bit number in the data stream Data according to the oversampling number of the clock signal CLK, wherein the estimation of the accumulated bit number is irrelevant to the type of packet in the data stream Data. The processing unit 111 estimates a bit number between adjacent transition edges according to the corresponding oversampling number between the two adjacent transition edges in FIG. 4, and accumulates the bit number between consecutive adjacent transition edges to obtain the accumulated bit number.

Step $S_{220}$: The processing unit 111 judges whether the accumulated bit number is larger than or equal to a predetermined value, wherein the predetermined value is at least 23 according to FIG. 3. When the accumulated bit number is larger than or equal to the predetermined value, move to Step $S_{230}$.

Step $S_{230}$: The processing unit 111 judges whether the oversampling number is larger than M times of the accumulated bit number, wherein M is a quotient obtained from dividing an expecting oscillation frequency of the programmable oscillator 12 or a system frequency of the USB device by a data rate of the USB data stream, i.e. the oversampling ratio. For example in FIG. 2b, M is 16. When the oversampling number is larger than the M times of the accumulated bit number, move to steps $S_{240}$~$S_{243}$ to decrease the oscillation frequency of the clock signal CLK. When the oversampling number is smaller than the M times of the accumulated bit number, move to steps $S_{250}$~$S_{253}$ to increase the oscillation frequency of the clock signal CLK.

Step $S_{240}$: When the oversampling number is larger than the M times of the accumulated bit number, subtract the M times of the accumulated bit number from the oversampling number to obtain a first difference.

Step $S_{241}$: The processing unit 111 obtains a down step number and sends it to the controller 112, wherein the down step number is defined as a relationship (the first difference/M times of the accumulated bit number)/(the calibration resolution/M times of the data rate of the data stream) herein. One down step number, for example, may be the frequency calibration resolution of the programmable oscillator 12. For example in a low-speed transmission, M may be 16 and M times of the data rate of the data stream may be 24 MHz, but the present invention is not limited to this.

Step $S_{242}$: The processing unit 111 judges whether the down step number is less than 1. If it is, move to Step $S_{260}$; otherwise, move to Step $S_{243}$.

Step $S_{243}$: When the processing unit 111 judges the down step number is larger than 1, the down step number $S_2$ will be transmitted to the controller 112. The controller 112 then accordingly sends a control signal $S_1$ to decrease the oscillation frequency of the programmable oscillator 12. In the meanwhile, the processing unit 111 prepares to perform the next calibration from Step $S_{210}$. In one embodiment, a down step number may be associated with a frequency between 110 KHz~140 KHz, but is not limited to this. In one embodiment, when the calculated down step number is not a positive integer, round-off method can be applied to transform the down step number to a positive integer.

Step $S_{260}$: When the processing unit 111 judges the down step number is smaller than 1, it means the oscillation frequency of the programmable oscillator 12 is stable and no calibration will be performed. Then, the processing unit 111 restarts to count the oversampling number of the clock signal CLK from the next bit of the counted counting interval CI, to estimate the accumulated bit number of the USB data stream, and to perform a next calibration from Step $S_{210}$. It is appreciated that if the last bit in the counting interval CI is just at the last bit of CRCS (refer to FIG. 2), the next counting interval will begin from the first bit of the SYNC field of next data packet.

Step $S_{250}$: When the oversampling number is smaller than the M times of the accumulated bit number, substrate the oversampling number from the M times of the accumulated bit number to obtain a second difference.

Step $S_{251}$: The processing unit 111 obtains a up step number and sends it to the controller 112, wherein the up step number is defined as a relationship (the second difference/M times of the accumulated bit number)/(the calibration resolution/M times of the data rate of the data stream. One up step number, for example, may be the frequency calibration resolution of the programmable oscillator 12.

Step $S_{252}$: The processing unit 111 judges whether the up step number is less than 1. If it is, move to Step $S_{260}$; otherwise, move to Step $S_{253}$.

Step $S_{253}$: When the processing unit 111 judges the up step number is larger than 1, the up step number $S_2$ will be transmitted to the controller 112. The controller 12 then accordingly sends a control signal $S_1$ to increase the oscillation frequency of the programmable oscillator 12. In the meanwhile, the processing unit 111 prepares to perform the next calibration from step $S_{210}$. In one embodiment, an up step number may be associated with a frequency between 110 KHz~140 KHz, but not limited to this. In one embodiment, when the calculated up step number is not a positive integers, round-off method can be applied to transform the up step number to a positive integer.

Figure 6:
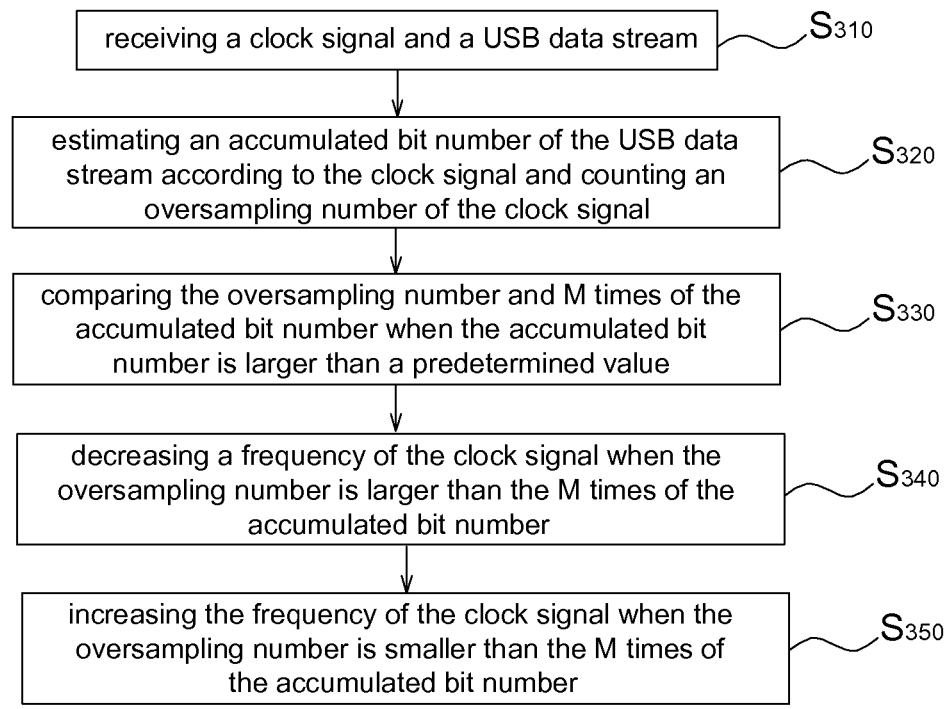
FIG. 6 shows a flow chart of the frequency calibration method for a programmable oscillator according to an embodiment of the present invention.

Therefore, the frequency calibration method for a programmable oscillator according to one embodiment of the present invention is shown in FIG. 6. The method includes the steps of: receiving a clock signal and a USB data stream (Step $S_{310}$); estimating an accumulated bit number of the USB data stream according to the clock signal and counting an oversampling number of the clock signal (Step $S_{320}$); comparing the oversampling number and M times of the accumulated bit number when the accumulated bit number is larger than or equal to a predetermined value (Step $S_{330}$); decreasing the frequency of the clock signal when the oversampling number is larger than the M times of the accumulated bit number (Step $S_{340}$); and increasing the frequency of the clock signal when the oversampling number is smaller than the M times of the accumulated bit number (Step $S_{350}$). Details of this embodiment have been shown in FIG. 5 and corresponding illustrations, and thus will not be repeated herein.

Figure 7:
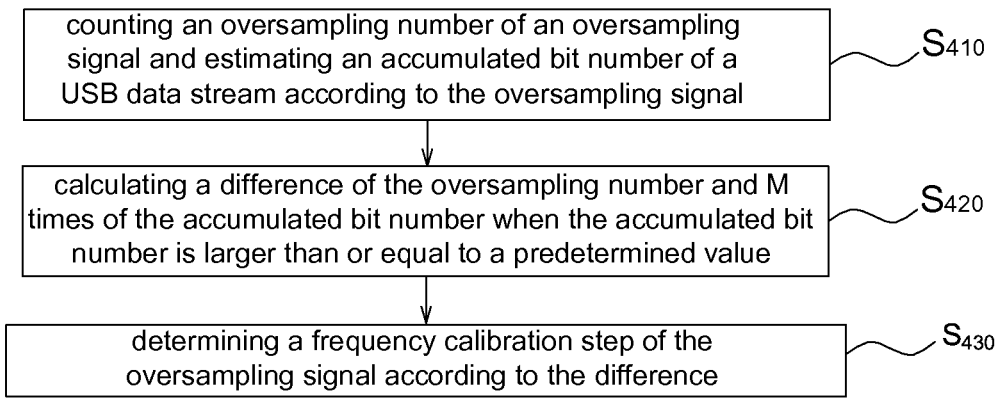
FIG. 7 is a flow chart of the frequency calibration method for a programmable oscillator in another embodiment of the present invention.

FIG. 7 shows the frequency calibration method for a programmable oscillator according to another embodiment of the present invention. The frequency calibration method is configured to calibrate an oversampling signal sent from a programmable oscillator according to a USB data stream. The frequency calibration method includes the steps of: counting an oversampling number of the oversampling signal and estimating an accumulated bit number of the USB data stream according to the oversampling signal (Step $S_{410}$); calculating a difference between the oversampling number and M times of the accumulated bit number when the accumulated bit number is larger than or equal to a predetermined value (Step $S_{420}$); and determining a frequency calibration step of the oversampling signal according to the difference (Step $S_{430}$).

Please refer to FIG. 8, it shows a maximum error of the programmable oscillator 12 after being calibrated once by the frequency calibration device and method of the present invention; wherein when an initial error is between 1% to 3%, the error after being calibrated once can be reduced to between 0.805% to 1.027%. In FIG. 8, for example the counting interval CI has two INPUT packets each including 32 bits (total 64 bits). A system frequency of a low-speed USB device (i.e. the oscillation frequency of the programmable oscillator 12) is assumed to be 24 MHz (i.e. the oversampling period is 41.667 nanosecond.), i.e. 16 times oversampling ratio. In the frequency calibration device and method for programmable oscillator of the present invention, the initial error is preferably calibrated within 3% to make the processing unit 111 estimate the correct bit number between adjacent transition edges according to FIG. 4. In addition, in this embodiment, the frequency calibration resolution of the programmable oscillator 12 is assumed between 110 KHz~140 KHz, but not limited to this.

The initial error of the programmable oscillator 12 is between 1% and 3%, which is shown in the first column of FIG. 8. And initial error of 1% is illustrated herein to explain the calculation method of the first row of FIG. 8, and since other rows have the same calculation method, detailed description will not be repeated again. In the second column, an ideal bit time of 64 bits is equal to 64×(1/1.5 MHz)=42,667 nanoseconds.

In the third column, the shortest bit time of 64 bits including jitter equals the ideal 64 bits time subtracts the maximum jitter time, i.e. 42,667−184=42,483 nanoseconds, wherein the maximum jitter time is referred to FIG. 3.

In the fourth column, the longest bit time of 64 bits including jitter equals the ideal 64 bits time adds the maximum jitter time, i.e. 42,667+184=42,851 nanoseconds.

The fifth column is the minimum oversampling number (min OS No.) in one counting interval CI that is (the shortest bit time×(1−the initial error)/the oversampling period)−the sampling error. In this embodiment, it is assumed that every data packet has one bit of sampling error, and thus the sampling error of two INPUT packets is two. The minimum oversampling number is equal to 42,483×(1−1%)/41.667)−2=1,007.

The sixth column is the maximum oversampling number (max OS No.) in one counting interval CI that is (the longest time×(1+the initial error)/the oversampling period)+the sampling error, i.e. 42,851×(1+1%)/41.667)+2=1,041.

The seventh and the eighth columns are respectively the minimum and the maximum values of the clock minimum rage, wherein the minimum value equals (the minimum oversampling number−1)×1000/the longest bit time, i.e. (1,007−1)×1,000/42,851=23.477 MHz; the maximum value equals (the minimum oversampling number−1)×1000/the shortest bit time, i.e. (1,007−1)×1,000/42,483=23.680 MHz.

The ninth and the tenth columns are respectively the minimum and the maximum values of the clock maximum rage, wherein the minimum value equals (the maximum oversampling number−1)×1000/the longest bit time, i.e. (1,041−1)×1,000/42,851=24.270 MHz; the maximum value equals (the maximum oversampling number−1)×1000/the shortest bit time, i.e. (1,041−1)×1,000/42,483 =24.480 MHz.

The eleventh column is the up step relative to different initial errors.

The twelfth and the thirteenth columns are respectively the minimum and the maximum frequencies of the oscillation frequency after being increased. The minimum frequency=the minimum value of the clock minimum range+ the up step×the minimum resolution, i.e. 23.477 MHz+3×110 KHz=23.807 MHz. The maximum frequency=the maximum value of the clock minimum range+the up step×the maximum resolution, i.e. 23.680 MHz+3×140 KHz=24.100 MHz.

The fourteenth column is the down step relative to different initial errors.

The fifteenth and the sixteenth columns are respectively the minimum and the maximum frequencies of the oscillation frequency after being decreased. The minimum frequency=the maximum value of the clock maximum range-the down step×the maximum resolution, i.e. 24.270 MHz−3× 140 KHz=23.850 MHz. The maximum frequency=the maximum value of the clock maximum range−the down step×the minimum resolution, i.e. 24.480 MHz−3×110 KHz=24.150 MHz.

The seventeenth column is the maximum error of the oscillation frequency after being calibrated, the maximum error happens at the minimum frequency after being increased, that is 100%×(24−23.807)/24=0.805%.

It is appreciated that although a low-speed transmission is described in the present invention, it is only exemplary. The frequency calibration device and method of the present invention is not limited to the low-speed USB device.

The self-calibrating oscillator circuit 1 is adaptable to a human interface device, e.g. a device capable of detecting information such as the displacement, velocity, gesture, hovering, distance or physiological feature, coupled (wired or wirelessly) to a host, but not limited thereto.

Figure 12:
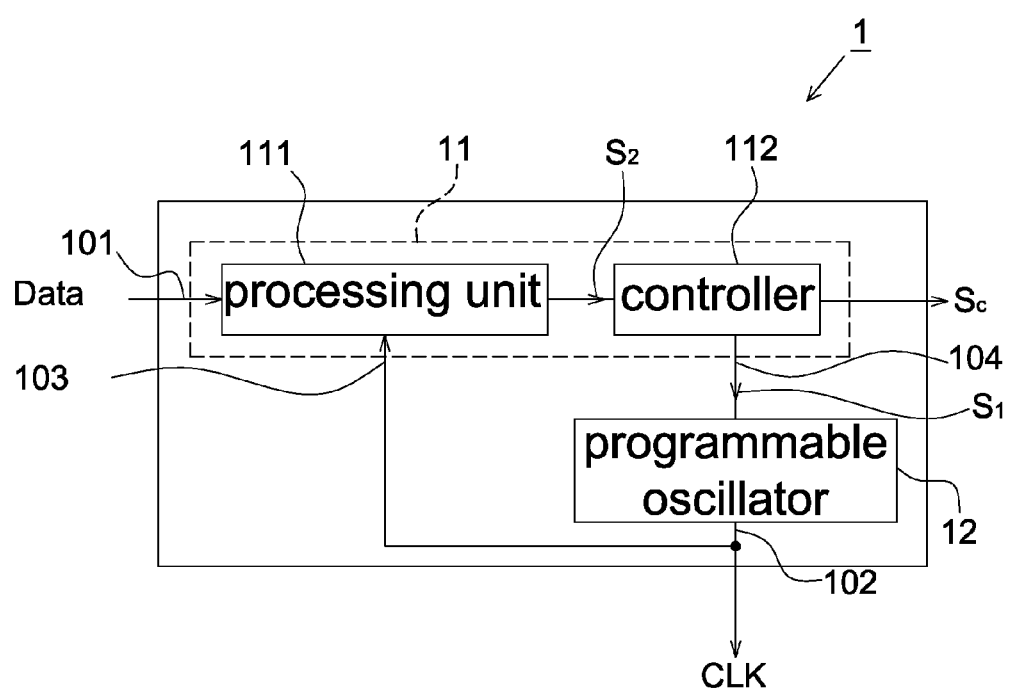
FIG. 12 is a block diagram of the self-calibrating oscillator circuit according to another embodiment of the present disclosure.

In some embodiments, the controller 112 does not output the control signal $S_1$ to adjust the clock signal CLK outputted from the programmable oscillator 12 but generates a correction parameter Sc (as shown in FIG. 12) to calibrate detected information obtained according to the unadjusted clock signal CLK, e.g. data recovered according to the unadjusted clock signal CLK, displacement or velocity calculated according to the unadjusted clock signal CLK, physiological feature calculated according to the unadjusted clock signal CLK or the like according to different applications of the human interface device.

In some embodiments, when the down step or the up step shown in FIG. 5 is smaller than 1 or a predetermined number, the detected information obtained according to the unadjusted clock signal CLK is calibrated according to the correction parameter Sc; whereas, when the down step or the up step is larger than 1 or the predetermined number, the clock signal CLK is adjusted according to the down step or the up step. In some embodiments, the detected information obtained according to the unadjusted clock signal CLK is calibrated according to the correction parameter Sc but the clock signal CLK is never adjusted.

In another embodiment, when the clock signal CLK is not adjusted to be within a tolerable error range (e.g. ±1.25%, but not limited to) according to the control signal $S_1$ (e.g. adjusting one adjustment frequency step each time), the controller 112 further generates a correction parameter Sc configured to calibrate the detected information obtained according to the coarse tuned clock signal CLK so as to increase the operating accuracy during the adjustment process.

Figure 13A:
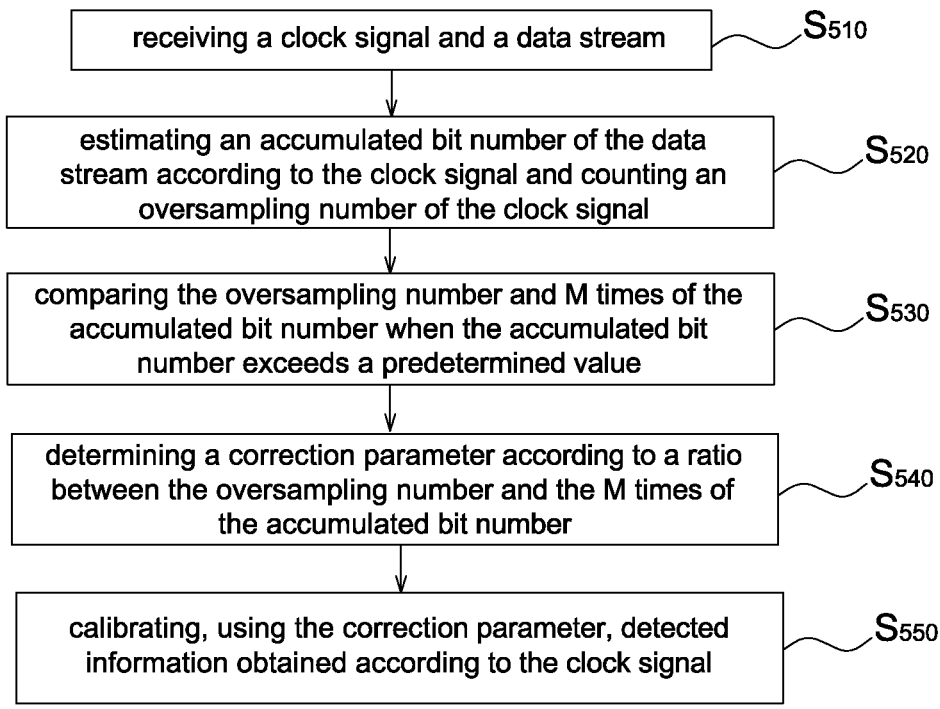
FIG. 13A-13B are flow charts of an operating method of a human interface device according to some embodiments of the present disclosure.

In some embodiments, the correction parameter Sc is determined according to a ratio between the oversampling number and M times of the accumulated bit number. FIG. 13A is a flow chart of an operating method of a human interface device according to one embodiment of the present disclosure. For example, the correction parameter Sc is equal to the ratio or is a multiple, a fraction or a shift of the ratio. For example, when the accumulated bit number exceeds a predetermined value (e.g. at least 23) and the oversampling number is larger than the M times of the accumulated bit number, it means that a frequency of the clock signal CLK is too fast and the correction parameter Sc may be arranged to be larger than 1; whereas, when the accumulated bit number exceeds the predetermined value and the oversampling number is smaller than the M times of the accumulated bit number, it means that the frequency of the clock signal CLK is too slow and the correction parameter Sc may be arranged to be smaller than 1, but the present disclosure not limited thereto. The arrangement of the correction parameter Sc (e.g. larger or smaller than 1) may be set according to different applications. Accordingly, even though the clock signal CLK is not adjusted and the human interface device operates based on the unadjusted clock signal CLK, correct detected information is still obtainable.

It should be mentioned that the correction parameter Sc is determined according different applications. In some embodiments, the correction parameter Sc is determined according to a ratio between the first difference (as shown in FIG. 5) and the M times of the accumulated bit number or according to a ratio between the second difference (as shown in FIG. 5) and the M times of the accumulated bit number. In some embodiments, the correction parameter Sc is determined according to the down step or the up step shown in FIG. 5 (herein the calibration resolution being associated with the detected information to be calibrated), but not limited thereto.

Figure 13B:
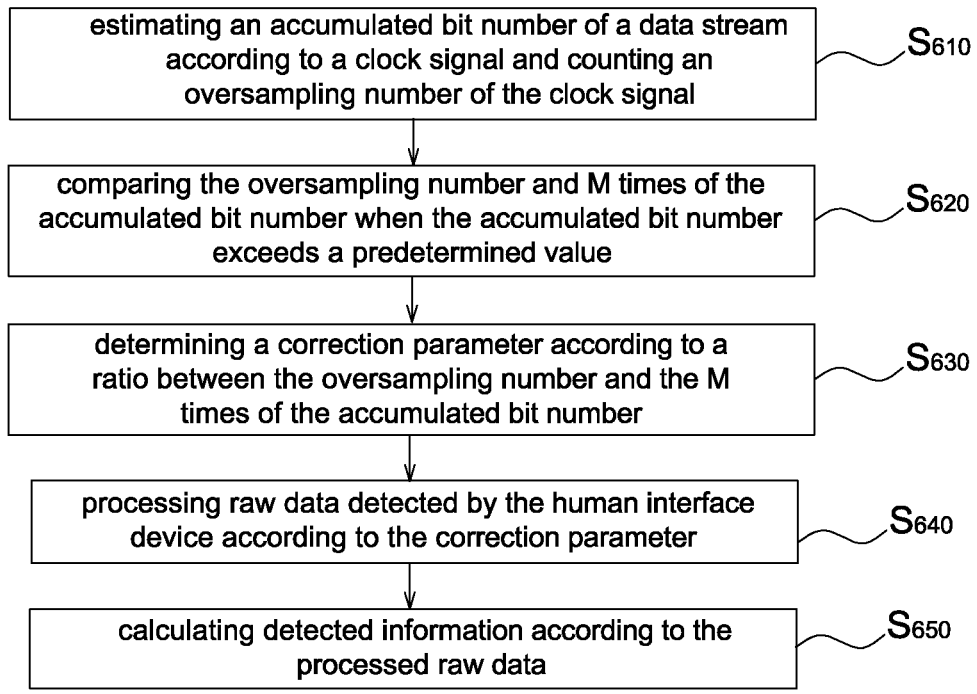

In other embodiments, it is able to firstly process the raw data detected by the human interface device according to the correction parameter Sc, wherein the raw data is for calculating said detected information. For example, when the detected information is the displacement, the raw data is the data of image features; whereas, when the detected information is the physiological feature, the raw data is photoplethysmograph (PPG) data, but the present disclosure is not limited thereto. FIG. 13B is a flow chart of an operating method of a human interface device according to one embodiment of the present disclosure.

For example, when the accumulated bit number exceeds a predetermined value (e.g. at least 23) and the oversampling number is larger than the M times of the accumulated bit number, it means that the frequency of the clock signal CLK is too fast and the downsampling process is performed to the raw data; whereas, when the accumulated bit number exceeds the predetermined value and the oversampling number is smaller than the M times of the accumulated bit number, it means that the frequency of the clock signal CLK is too slow and the upsampling process (e.g. interpolation) is performed to the raw data, wherein whether the downsampling or upsampling process is performed is determined according to different applications. Finally, the detected information is calculated according to the processed raw data. Accordingly, even though the clock signal CLK is not adjusted and the human interface device operates based on the unadjusted clock signal CLK, correct detected information is still obtainable.

Figure 9:
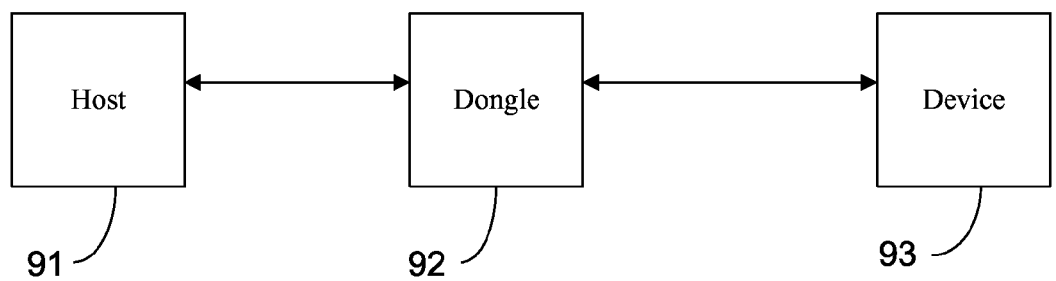
FIG. 9 is a block diagram of the application using present invention.

The present invention can be applied in wireless communication. In this application, a device has to communicate with a host via a dongle connected to the host or embedded transceiver module of the host. FIG. 9 shows a block diagram of the application using present invention. Dongle 92 can generate a calibrated frequency based on a precise clock of host 91 by applying the aforementioned method of the present invention. Then the device 93 can generate a calibrated oscillation frequency based on the calibrated frequency of dongle 92. When a communication is established between the dongle 92 and the device 93, usually one of device 93 and dongle 92 will transmit a request for communication, and then another one of device 93 and dongle 92 will acknowledge the request to establish communication. When dongle 92 starts to transmit payload to device 93, the payload is configured to carry a synchronous signal. The synchronous signal has a carrier frequency and a signal frequency both being recognized by the dongle 92 and device 93. The device 93 receives the synchronous signal, and meanwhile the device 93 generates an oscillation frequency internally.

Presently, the initial oscillation frequency of the device 93 is not calibrated, thus the device 93 can retrieve the signal frequency from the synchronous signal. The signal frequency is recognized by the device 93, thus the device 93 can calibrate the oscillation frequency according to the signal frequency. Generally, the device 93 can calibrate the oscillation frequency in time domain or in frequency domain, which will be separately explained as below.

Figure 10:
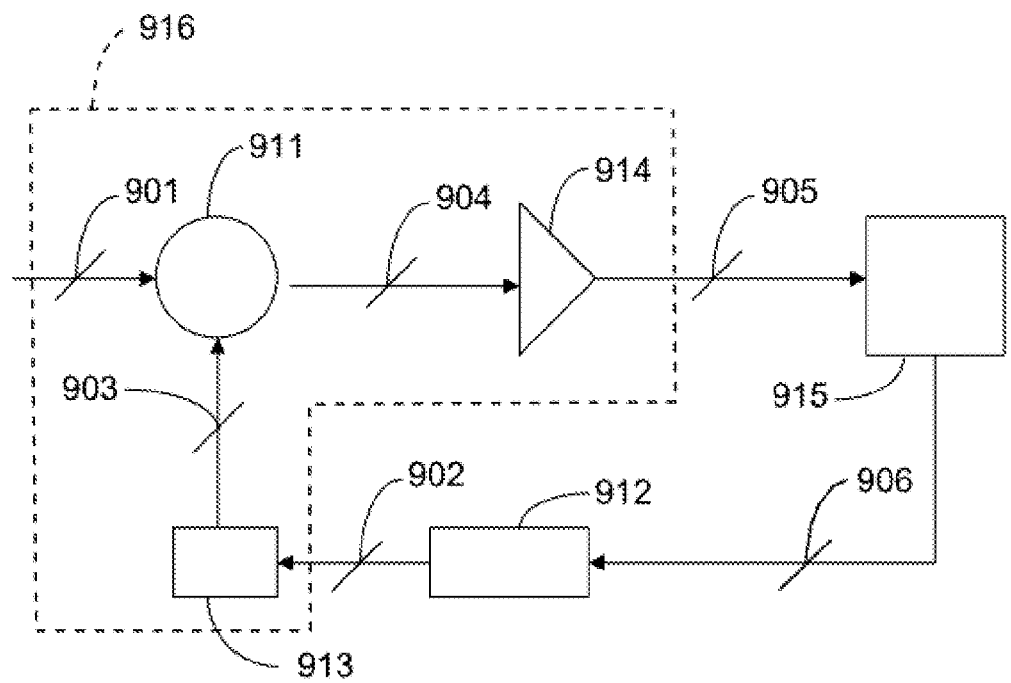
FIG. 10 is an exemplary block diagram inside the device.

FIG. 10 shows an exemplary block diagram inside the device 93. A receiver 916 receives the synchronous signal 901, which comprises a carrier frequency (denoted as Fcarrier) and a signal frequency (denoted as Fsignal), the receiver 916 then receives an oscillation frequency 902 from the oscillator 912. The oscillation frequency 902 comprises an oscillation frequency (denoted as Fosc) and an error frequency (denoted as FEosc) since the oscillator has not been calibrated. Then the receiver 916 generates a sampled signal 905 comprising an additional frequency (denoted as Fadd) plus Fsignal plus multiplied FEosc (denoted as A*FEosc, wherein "A" is a multiple). The sampled signal 905 is then processed by the demodulator 915 to retrieve an error correct signal 906 corresponding to FEosc. The oscillator 912 then calibrates oscillation frequency according to the error correct signal 906. When the error correct signal 906 indicates that the previous oscillation frequency is faster, the oscillator 912 decreases the oscillation frequency, and vice versa.

In this embodiment, the receiver 916 is implemented by circuits of a mixer 911, a converter 914, and a synthesizer 913. The synchronous signal 901 is received by the mixer 911. The synthesizer 913 synthesizes the oscillation frequency 902 into a predetermined frequency 903 having the Fcarrier, the Fadd, and the A*FEosc. The mixer 911 then mixes the predetermined signal 903 with the synchronous signal 901 to eliminate the Fcarrier and retrieve a mixed signal 904 comprising the Fsignal, Fadd and A*FEosc. The Fadd is particularly designed and generated by the synthesizer 913, which will be put into the predetermined frequency 903 when Fosc is synthesized. Fadd is designed for eliminating Fcarrier when mixing the synchronous signal and the predetermined signal. The mixed signal 904 is then converted by the converter 914 to generate the sampled signal 905 comprising information of the Fsignal, Fadd, and A*FEosc. The demod 915 then demodulates the sampled signal 905.

Since the Fsignal, Fadd, and A are assigned by the system, the demod 915 is able to demodulate the sampled signal 905 and then figure out the FEosc. FEosc represents the error term when the oscillator 912 generates frequency. The oscillator 912 cannot identify the error term by itself, thus, after the aforementioned operation, the demod 915 can identify FEosc for the oscillator 912 to calibrate the oscillation frequency. The calibration operation can be a feedback operation, thus the oscillation frequency can be repeatedly calibrated until the oscillation frequency is within a precise range. Since the Fsignal, Fadd, and A*FEosc are all frequency, the demod 915 can demodulate the sampled signal 905 in frequency domain. For example, the demod 915 can subtract the Fsignal and Fadd portions from the sampled signal, and the remaining portion is solely related to A*FEosc. Multiple A is known, thus the demod 915 can then divide the remaining portion by A to retrieve FEosc portion for calibrating the oscillation frequency.

Figure 11:
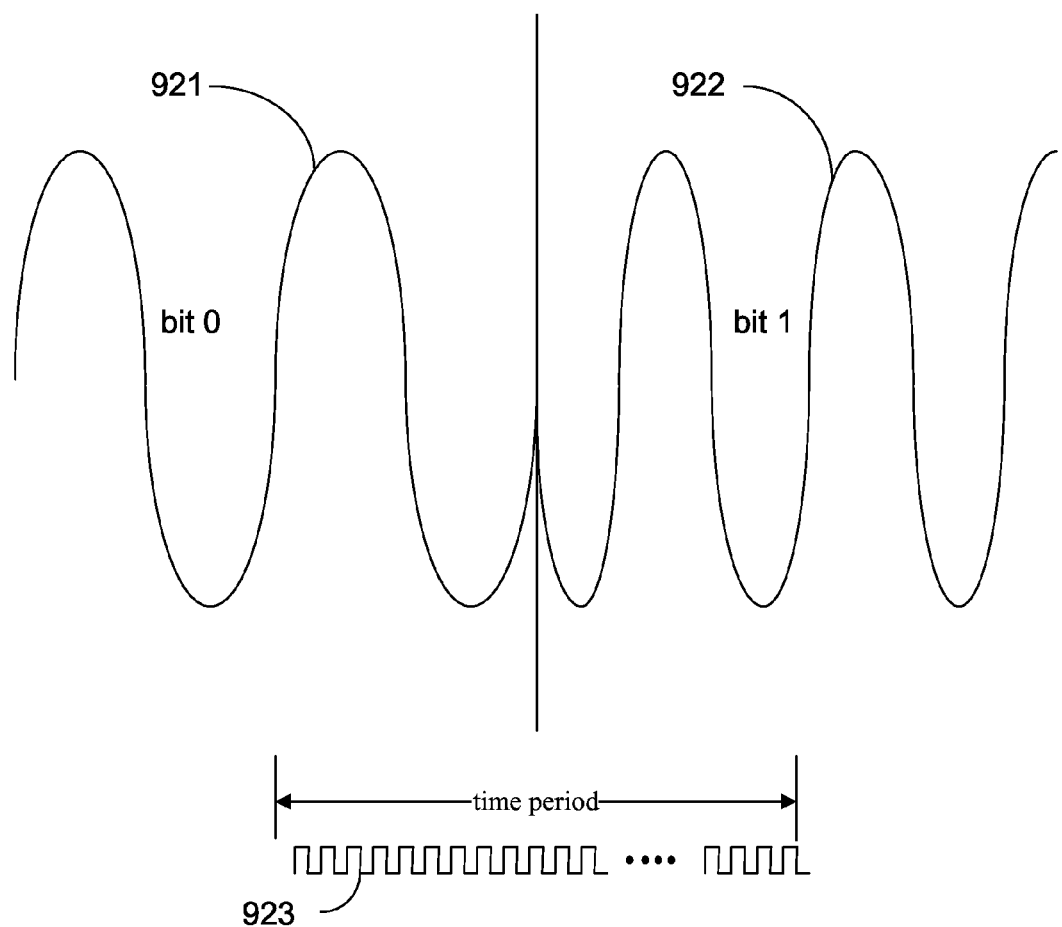
FIG. 11 is an exemplary diagram of demodulation in time domain.

In another embodiment, the demod 915 can demodulate the sampled signal 905 in time domain. FIG. 11 shows an exemplary diagram of demodulation in time domain. Assuming the Fsignal is a sequence of repeated bit "0" following up with bit "1", and the time period from the center of bit "0" (denotes as signal 921) to the adjacent bit "1" (denoted as signal 922) is predetermined. The demod 915 then counts the time period by a fast frequency signal 923, when it counts to the end of time period, a counting number is generated. The fast frequency signal 923 is generated based on the oscillation frequency. The time period is predetermined based on the precise Fsignal, and if the oscillation frequency is precise too, the counting number will be almost equal to a predetermined value. When the counting number is larger than the predetermined value, which means the oscillation frequency is too fast, the oscillator 912 decreases the oscillation frequency, and vice versa.

In other embodiments, the error frequency FEosc (or the error correct signal 906) is not to adjust the oscillation frequency of the oscillator 912 but to calibrate the detected information obtained according to the unadjusted oscillation frequency as mentioned above, e.g. data recovered according to the unadjusted oscillation frequency, displacement or velocity calculated according to the unadjusted oscillation frequency, physiological feature calculated according to the unadjusted oscillation frequency or the like according to different applications of the human interface device. Accordingly, even though the oscillation frequency of the oscillator 912 is not adjusted and the human interface device operates based on the unadjusted oscillation frequency, correct detected information is still obtainable.

For example, when the error frequency FEosc (or the error correct signal 906) shows that the oscillation frequency of the oscillator 912 is too fast, the detected information is increased (or decreased), or the raw data is performed with downsampling process and then the processed raw data is configured to calculate the detected information. For example, when the error frequency FEosc (or the error correct signal 906) shows that the oscillation frequency of the oscillator 912 is too slow, the detected information is decreased (or increased), or the raw data is performed with upsampling process (e.g. interpolation) and then the processed raw data is configured to calculate the detected information. As mentioned above whether the downsampling or upsampling process is performed is determined according to different applications.

As described above, the extra precise clock device used in conventional USB device has a higher cost and needs extra pins to communicate thereto. The present invention further provides a frequency calibration device and method for a programmable oscillator without external precise oscillator that can automatically and real-timely calibrate an oscillation frequency of a programmable oscillator according to the received arbitrary packet types in the USB data stream.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An operating method of a human interface device, the operating method comprising:
   estimating an accumulated bit number of bits between a
      first bit of a SYNC field and a bit immediately preceding an End-of-Packet of a data packet in a USB data stream according to a clock signal and counting an oversampling number of the clock signal;

comparing the oversampling number and M times of the accumulated bit number when the accumulated bit number exceeds a predetermined value;

determining a correction parameter according to a ratio between the oversampling number and the M times of the accumulated bit number; and calibrating, using the correction parameter, detected information obtained according to the clock signal.

2. The operating method as claimed in claim 1, wherein the clock signal is generated by a programmable oscillator and the method further comprises:

adjusting the clock signal according to a comparison result of comparing the oversampling number and the M times of the accumulated bit number.

3. The operating method as claimed in claim 2, further comprising:

decreasing a frequency of the clock signal when the oversampling number is larger than the M times of the accumulated bit number; and increasing the frequency of the clock signal when the oversampling number is smaller than the M times of the accumulated bit number.

4. The operating method as claimed in claim 1, wherein the predetermined value is at least 23.

5. The operating method as claimed in claim 1, wherein M is a quotient obtained from dividing an expecting frequency of the clock signal by a data rate of the USB data stream.

6. An operating method of a human interface device, the operating method comprising:

estimating an accumulated bit number of bits between a first bit of a SYNC field and a bit immediately preceding an End-of-Packet of a data packet in a USB data stream according to a clock signal and counting an oversampling number of the clock signal;

comparing the oversampling number and M times of the accumulated bit number when the accumulated bit number exceeds a predetermined value;

determining a correction parameter according to a ratio between the oversampling number and the M times of the accumulated bit number; and processing raw data detected by the human interface device according to the correction parameter; and calculating detected information according to the processed raw data.

7. The operating method as claimed in claim 6, wherein the clock signal is generated by a programmable oscillator and the method further comprises:

adjusting the clock signal according to a comparison result of comparing the oversampling number and the M times of the accumulated bit number.

8. The operating method as claimed in claim 7, further comprising:

decreasing a frequency of the clock signal when the oversampling number is larger than the M times of the accumulated bit number; and increasing the frequency of the clock signal when the oversampling number is smaller than the M times of the accumulated bit number.

9. The operating method as claimed in claim 6, wherein the processing further comprises:

performing downsampling process to the raw data when the oversampling number is larger than the M times of the accumulated bit number; and performing upsampling process to the raw data when the oversampling number is smaller than the M times of the accumulated bit number.

10. The operating method as claimed in claim 6, wherein the predetermined value is at least 23.

11. The operating method as claimed in claim 6, wherein M is a quotient obtained from dividing an expecting frequency of the clock signal by a data rate of the USB data stream.

12. An operating method of a human interface device, the human interface device being wirelessly coupled to a programmable oscillator and comprising an oscillator, a demodulator and a receiver, the operating method comprising:

estimating an accumulated bit number of bits between a first bit of a SYNC field and a bit immediately preceding an End-of-Packet of a data packet in a USB data stream according to a clock signal and counting an oversampling number of the clock signal;

comparing the oversampling number and M times of the accumulated bit number when the accumulated bit number exceeds a predetermined value;

decreasing a frequency of the clock signal when the oversampling number is larger than the M times of the accumulated bit number;

increasing the frequency of the clock signal when the oversampling number is smaller than the M times of the accumulated bit number;

receiving a packet for communication request from the human interface device;

transmitting a packet for reply to the communication request with a payload comprising a synchronous signal;

receiving the synchronous signal by the receiver;

generating an oscillation frequency by the oscillator;

mixing the synchronous signal and the oscillation frequency to retrieve a sampled signal;

demodulating the sampled signal by the demodulator to retrieve an error correct signal; and calibrating, using the error correct signal, detected information obtained according to the oscillation frequency, wherein the synchronous signal corresponds to the trimmed frequency of the clock signal.

13. The operating method as claimed in claim 12, wherein the synchronous signal comprises a carrier frequency and a signal frequency, and the oscillation frequency comprises an error frequency, the method further comprises:

synthesizing the oscillation frequency to a predetermined frequency;

eliminating the carrier frequency by mixing the synchronous signal with the predetermined frequency; and estimating the error frequency by identifying the signal frequency and an additional frequency, wherein the error correct signal corresponds to the error frequency.

14. The operating method as claimed in claim 13, further comprising:

setting the signal frequency and the additional frequency in advance;

identifying the signal frequency and the additional frequency;

estimating the error frequency by counting an adjacent bit "1" level and bit "0" level of the signal frequency to retrieve a counting number.

15. The operating method as claimed in claim 13, further comprising:

setting the signal frequency and the additional frequency in advance;

identifying the signal frequency and the additional frequency;

eliminating the carrier frequency by mixing the synchronous signal with the predetermined frequency to retrieve the sampled signal; and estimating the error frequency by subtracting the signal frequency and the additional frequency from the sampled signal.

16. The operating method as claimed in claim 12, wherein the receiver comprises a mixer, a converter and a synthesizer, and the method further comprises:

receiving the synchronous signal by the mixer;

generating the oscillation frequency by the oscillator to the synthesizer, wherein the oscillation frequency comprises a frequency and an error frequency;

generating a carrier frequency plus an additional frequency plus a multiplied error frequency to the mixer by the synthesizer;

mixing the carrier frequency plus the additional frequency plus the multiplied error frequency with the synchronous signal by the mixer to retrieve the additional frequency, a signal frequency and the multiplied error frequency;

converting the additional frequency, the signal frequency and the multiplied error frequency to the sampled signal; and demodulating the sampled signal to identify the error frequency, wherein the error correct signal corresponds to the error frequency.

* * * * *